US011545397B2

(12) United States Patent
Lin et al.

(10) Patent No.: US 11,545,397 B2
(45) Date of Patent: Jan. 3, 2023

(54) SPACER STRUCTURE FOR SEMICONDUCTOR DEVICE AND METHOD FOR FORMING THE SAME

(71) Applicant: Taiwan Semiconductor Manufacturing Co., Ltd., Hsinchu (TW)

(72) Inventors: Han-Yu Lin, Nantou County (TW); Jhih-Rong Huang, Hsinchu (TW); Yen-Tien Tung, Hsinchu (TW); Tzer-Min Shen, Hsinchu (TW); Fu-Ting Yen, Hsinchu (TW); Gary Chan, Hsinchu (TW); Keng-Chu Lin, Ping-Tung (TW); Li-Te Lin, Hsinchu (TW); Pinyen Lin, Rochester, NY (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/143,698

(22) Filed: Jan. 7, 2021

(65) Prior Publication Data

US 2022/0020644 A1 Jan. 20, 2022

Related U.S. Application Data

(60) Provisional application No. 63/052,243, filed on Jul. 15, 2020.

(51) Int. Cl.
*H01L 21/8234* (2006.01)
*H01L 21/3065* (2006.01)

(52) U.S. Cl.
CPC .. *H01L 21/823431* (2013.01); *H01L 21/3065* (2013.01); *H01L 21/823418* (2013.01)

(58) Field of Classification Search
CPC ............ H01L 21/02603; H01L 21/306; H01L 21/3065; H01L 21/823418; H01L 21/823431; H01L 21/823821; H01L 27/085; H01L 27/092; H01L 27/0924; H01L 29/0669; H01L 29/0673; H01L 29/42392; H01L 29/66439; H01L 29/66545; H01L 29/66553; H01L 29/775; H01L 29/785; H01L 29/786;
(Continued)

(56) References Cited

U.S. PATENT DOCUMENTS 9,799,748 B1 * 10/2017 Xie ................... H01L 29/66545
2019/0386113 A1 * 12/2019 Loubet .............. H01L 29/78696

* cited by examiner

*Primary Examiner* — Cheung Lee
(74) *Attorney, Agent, or Firm* — Sterne, Kessler, Goldstein & Fox P.L.L.C.

(57) ABSTRACT

The present disclosure describes a semiconductor structure and a method for forming the same. The method can include forming a fin structure over a substrate. The fin structure can include a channel layer and a sacrificial layer. The method can further include forming a first recess structure in a first portion of the fin structure, forming a second recess structure in the sacrificial layer of a second portion of the fin structure, forming a dielectric layer in the first and second recess structures, and performing an oxygen-free cyclic etching process to etch the dielectric layer to expose the channel layer of the second portion of the fin structure. The oxygen-free cyclic etching process can include two etching processes to selectively etch the dielectric layer over the channel layer.

20 Claims, 14 Drawing Sheets

(58) Field of Classification Search
CPC ........ H01L 29/78651; H01L 29/78696; B82Y 10/00; B82Y 40/00
See application file for complete search history.

SPACER STRUCTURE FOR SEMICONDUCTOR DEVICE AND METHOD FOR FORMING THE SAME

CROSS-REFERENCE TO RELATED APPLICATION

This application claims the benefit of U.S. Provisional Patent Application No. 63/052,243, titled "Inner Spacer for Semiconductor Device," which was filed on Jul. 15, 2020 and is incorporated herein by reference in its entirety.

BACKGROUND

Advances in semiconductor technology has increased the demand for semiconductor devices with higher storage capacity, faster processing systems, higher performance, and lower costs. To meet these demands, the semiconductor industry continues to scale down the dimensions of semiconductor devices, such as nano-sheet FETs. Such scaling down has increased the complexity of semiconductor manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
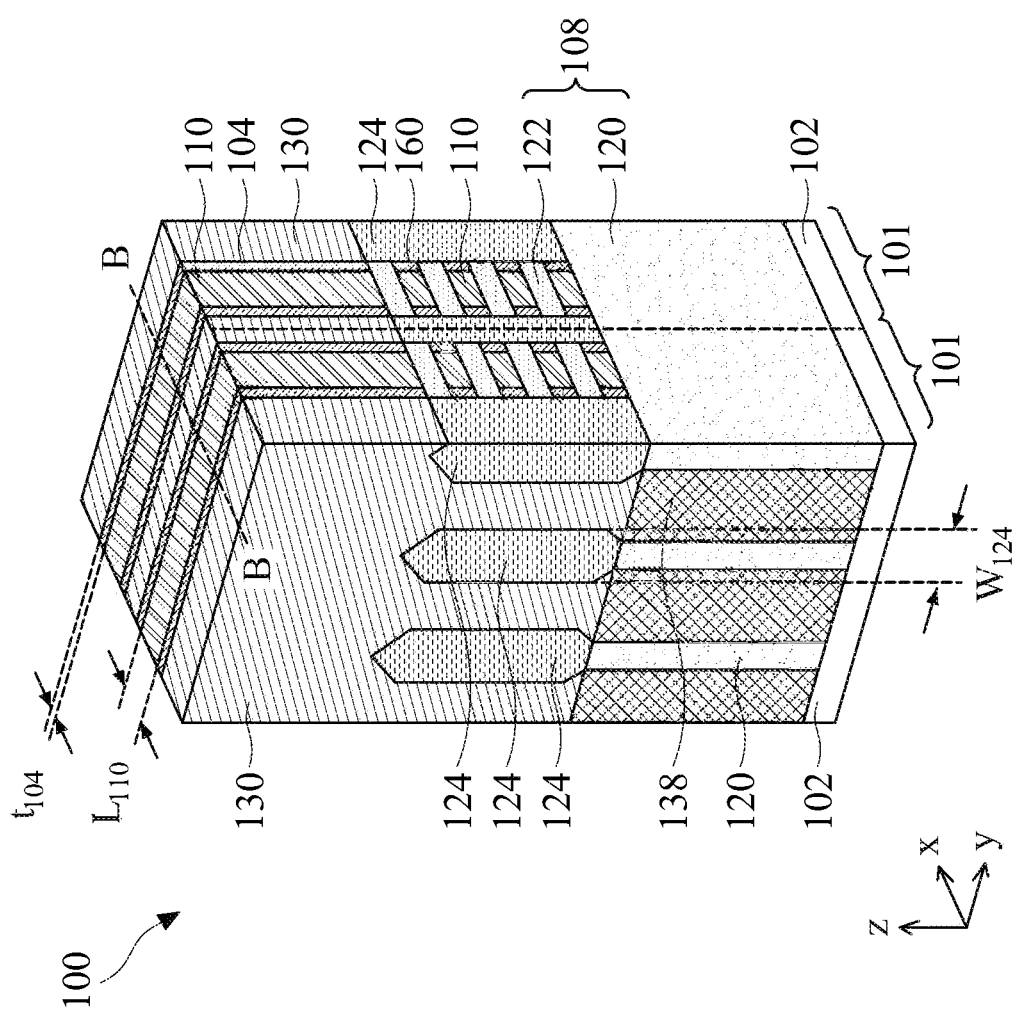
FIG. 1 is an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

Fins associated with fin field effect transistors (finFETs) or gate-all-around (GAA) FETs can be patterned by any suitable method. For example, the fins can be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers can then be used to pattern the fins.

Technology advances in the semiconductor industry drive the pursuit of integrated circuits (ICs) having higher device density, higher performance, and lower cost. In the course of the IC evolution, nano-sheet transistors can replace planar field effect transistor (FET) and fin field-effect transistor (finFET) to achieve ICs with higher device densities. Nano-sheet transistors can use a gate-all-around (GAA) gate structure to surround each nano-sheet channel layer to effectively reconcile short channel effects. Nano-sheet transistors require an inner spacer to physically separate the nano-sheet transistor's source-drain (S/D) regions from the nano-sheet transistor's GAA gate structure. The process of forming the inner spacer can include an inner spacer trimming process that removes an inner spacer material between the S/D region and the nano-sheet channel layer. The inner spacer trimming process may not be a wet etching process, because the wet etching process may not provide a sufficient wafer-scale etching uniformity for achieving the inner spacer with wafer-scale thickness uniformity. The inner spacer trimming process can be a dry etching process with an inner-spacer-dry-etchant to etch the inner spacer material. To protect the nano-sheet channel layer from being damaged by the dry etching process, the dry etching process can further include an oxygen radical to reduce an adsorption of the inner-spacer-dry-etchant on the nano-sheet channel layer. However, the oxygen-contained etchant can also reduce the adsorption of the inner-spacer-dry-etchant on the inner spacer material. The reduction of the adsorption of the inner-spacer-dry-etchant on the inner spacer material can degrade the inner spacer trimming process's etching rate and the inner spacer trimming process's etching uniformity, thus degrading the IC manufacturing's yield and throughput.

To address the aforementioned challenges, the present disclosure is directed to a fabrication method of an inner spacer for a gate-all-around field effect transistor (GAA FET). The process of forming the inner spacer can include forming a recess structure in a substrate and forming a dielectric layer in the recess structure. The process of forming the inner spacer can further include performing an inner spacer dry etching process to remove the dielectric layer to expose the recess structure's side surface. The inner spacer dry etching process can be oxygen-free dry etching process (e.g., the dry etching processes do not apply any oxygen-contained etchants) to avoid the aforementioned challenges of inner spacer trimming process susceptible to the reduced etching rate and reduced etching uniformity. Further, the inner spacer dry etching process can be a cyclic dry etching process. Each cycle of the cyclic dry etching process can include a first radical etching process to etch the dielectric layer with a first etchant that includes a first halogen element. For example, the first etchant can be a fluorine radical that can adsorb onto and react with the dielectric material to etch the dielectric material. The first radical etching process can further include a hydrogen-contained etchant, such as a hydrogen radical, to increase the etching rate of etching the dielectric layer.

The cyclic dry etching process can include a second radical etching process to etch the dielectric layer with a second etchant that includes a second halogen element. For example, the second etchant can be a chlorine radical that can facilitate the reaction between the dielectric layer and portions of the first etchants previously adsorbed on the dielectric layer's surface to etch the dielectric material. Therefore, the second radical etching process can etch the dielectric layer with a compatible (e.g., substantially equal) etching rate as the first radical etching process. The second etchant can further adsorb on the recess structure's side surface to form an interfacial layer thereon. The interfacial layer can protect the recess structure's side surface from being etched by the second radical etching process. Further, the interfacial layer can protect the recess structure's side surface from being etched by the first radical etching processes of subsequent cycles of the cyclic dry etching process. Therefore, the overall inner spacer dry etching process can have an enhanced etching rate of etching the dielectric material and an reduced etching rate of etching the recess structure's side surface. A benefit of the present disclosure, among others, is to increase the etching rate and etching selectivity of the inner spacer trimming process (e.g., the inner spacer dry etching process), thus improving the IC manufacturing's yield and throughput.

Figure 2:
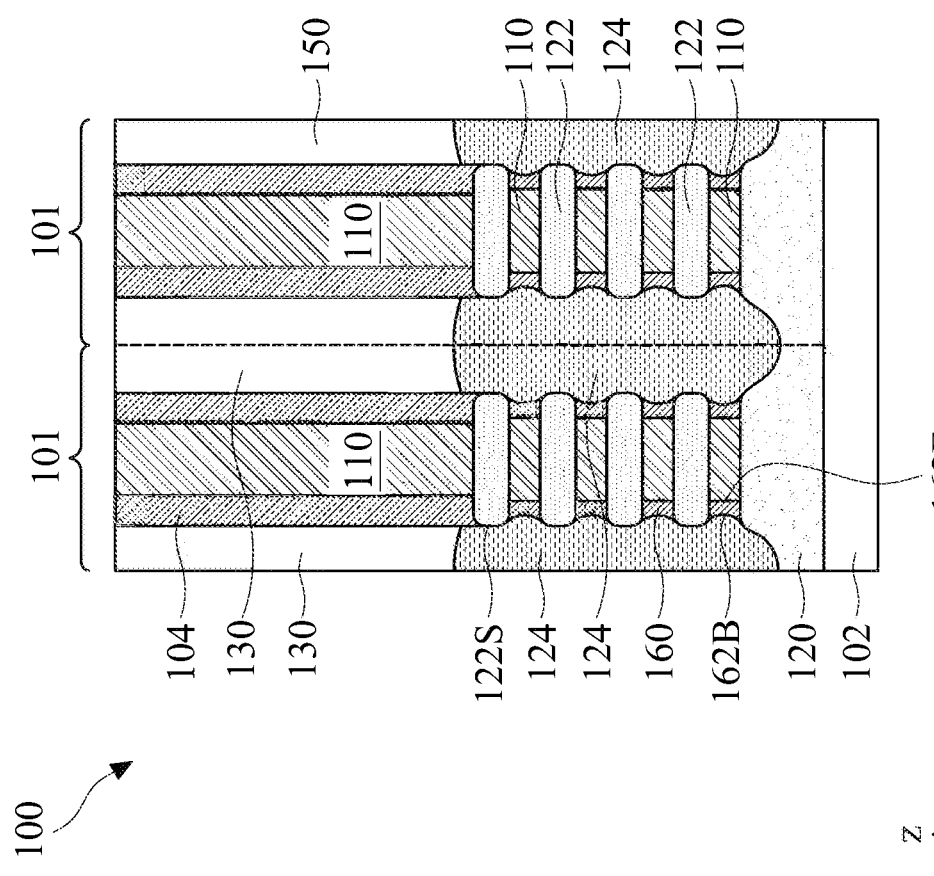
FIG. 2 is a cross-sectional view of a semiconductor device, according to some embodiments.

A semiconductor device 100 having multiple FETs 101 formed over a substrate 102 is described with reference to FIGS. 1 and 2, according to some embodiments. FIG. 1 illustrates an isometric view of semiconductor device 100, according to some embodiments. FIG. 2 illustrates a cross-sectional (e.g., along the x-z plane) view of semiconductor device 100 along line B-B of FIG. 1, according to some embodiments. The discussion of elements in FIGS. 1 and 2 with the same annotations applies to each other, unless mentioned otherwise. Semiconductor device 100 can be included in a microprocessor, memory cell, or other integrated circuit (IC). Also, each FET 101 shown in FIGS. 1 and 2 can be a GAA FET, according to some embodiments.

Referring to FIG. 1, substrate 102 can be a semiconductor material, such as silicon. In some embodiments, substrate 102 can include a crystalline silicon substrate (e.g., wafer). In some embodiments, substrate 102 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped depending on design requirements (e.g., p-type substrate or n-type substrate). In some embodiments, substrate 102 can be doped with p-type dopants (e.g., boron (B), indium (In), aluminum (Al), or gallium (Ga)) or n-type dopants (e.g., phosphorus (P) or arsenic (As)).

FET 101 can include a fin structure 108 extending along an x-direction, a gate structure 110 traversing through fin structure 108 along a y-direction, and S/D regions 124 formed over portions of fin structure 108. Although FIG. 1 shows fin structure 108 accommodating two FETs 101, any number of FETs 101 can be disposed along fin structure 108. In some embodiments, FET 101 can include multiple fin structures 108 extending along a first horizontal direction (e.g., in the x-direction) and gate structure 110 traversing through the multiple fin structures 108 along a second horizontal direction (e.g., in the y-direction).

Fin structure 108 can include a buffer region 120 formed over substrate 102. Fin structure 108 can further include one or more channel regions 122 formed over buffer region 120. Each channel region 122 can be wrapped by gate structure 110 to function as FET 101's channel. For example, a top surface, side surfaces, and a bottom surface of each channel region 122 can be surrounded and in physical contact with gate structure 110. Buffer region 120 and channel region 122 can be made of materials similar to (e.g., lattice mismatch within 5%) substrate 102. In some embodiments, each of buffer region 120 and channel region 122 can be made of Si or SiGe. Each of buffer region 120 and channel region 122 can be un-doped, doped with p-type dopants, doped with n-type dopants, or doped with intrinsic dopants. In some embodiments, buffer region 120 and channel regions 122 can be both doped with p-type dopants or doped with n-type dopants.

Gate structure 110 can be a multilayered structure (not shown in FIG. 1) that wraps around each channel region 122 to modulate FET 101. Gate structure 110 can have a length $L_{110}$ representing FET 101's channel length. In some embodiments, length $L_{110}$ can be less than about 50 nm, less than about 40 nm, less than about 30 nm, less than about 20 nm, or less than about 15 nm. If length $L_{110}$ is above these upper limits, semiconductor device 100 may not meet the fin pitch requirement determined by the respective technology node (e.g., fin pitch may be required to be less than about 60 nm for a 22 nm technology node). Gate structure 110 can include a gate dielectric layer (not shown in FIG. 1) and a gate electrode (not shown in FIG. 1) disposed on the gate dielectric layer. The gate dielectric layer can include any suitable dielectric material with any suitable thickness that can provide channel modulation for FET 101. In some embodiments, the gate dielectric layer can be made of silicon oxide or a high-k dielectric material (e.g., hafnium oxide or aluminum oxide). In some embodiments, the gate dielectric layer can have a thickness ranging from about 1 nm to about 5 nm. Based on the disclosure herein, other materials and thicknesses for the gate dielectric layer are within the spirit and scope of this disclosure. The gate electrode can function as a gate terminal for FET 101. The gate electrode can include any suitable conductive material that provides a suitable work function to modulate FET 101. In some embodiments, the gate electrode can be made of titanium nitride, tantalum nitride, tungsten nitride, titanium, aluminum, copper, tungsten, tantalum, copper, or nickel. Based on the disclosure herein, other materials for the gate electrode are within the spirit and scope of this disclosure.

S/D regions 124 can be formed over opposite sides (e.g., along x-direction) of each channel region 122 and gate structure 110. S/D regions 124 can be in contact with channel region 122's side surface 122S to function as FET 101's source and drain terminals. S/D regions 124 can have any suitable lateral (e.g., in the y-direction) width $W_{124}$ such as from about 20 nm to about 200 nm. S/D regions 124 can be made of an epitaxially-grown semiconductor material similar to (e.g., lattice mismatch within 5%) channel region 122. In some embodiments, S/D regions 124 can be made of Si, Ge, SiGe, InGaAs, or GaAs. S/D regions 124 can be doped with p-type dopants, n-type dopants, or intrinsic dopants. In some embodiments, S/D region 124 can have a different doping type from channel region 122.

Semiconductor device 100 can further include a gate spacer 104 formed between gate structure 110 and S/D region 124. In some embodiments, gate spacer 104 can be further formed over fin structure 108's side surface. Gate spacer 104 can be made of any suitable dielectric material. In some embodiments, gate spacer 104 can be made of silicon oxide, silicon nitride, or a low-k material with a dielectric constant less than about 3.9. In some embodiments, gate spacer 104 can have a suitable thickness $t_{104}$ from about 5 nm to about 15 nm or from about 5 nm to about 10 nm. If thickness $t_{104}$ is above these upper limits, FET 101's speed may be degraded due to a high channel resistance. If thickness $t_{104}$ is below these lower limits, FET 101's speed may be degraded due to a high gate-to-source/drain parasitic capacitance. Based on the disclosure herein, other materials and thicknesses for gate spacer 104 are within the spirit and scope of this disclosure.

Semiconductor device 100 can further include shallow trench isolation (STI) regions 138 to provide electrical isolation between fin structures 108. Also, STI regions 138 can provide electrical isolation between FET 101 and neighboring active and passive elements (not shown in FIG. 1) integrated with or deposited on substrate 102. STI regions 138 can include one or more layers of dielectric material, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials. Based on the disclosure herein, other dielectric materials for STI region 138 are within the spirit and scope of this disclosure.

Semiconductor device 100 can further include an interlayer dielectric (ILD) layer 130 to provide electrical isolation to structural elements it surrounds or covers, such as gate structure 110 and S/D regions 124. In some embodiments, gate spacer 104 can be formed between gate structure 110 and ILD layer 130. ILD layer 130 can include any suitable dielectric material to provide electrical insulation, such as silicon oxide, silicon dioxide, silicon oxycarbide, silicon oxynitride, silicon oxy-carbon nitride, and silicon carbonitride. ILD layer 130 can have any suitable thickness, such as from about 50 nm to about 200 nm, to provide electrical insulation. Based on the disclosure herein, other insulating materials and thicknesses for ILD layer 130 are within the spirit and scope of this disclosure.

Referring to FIG. 2, semiconductor device 100 can further include an inner spacer structure 160 formed protruding into fin structure 108. Inner spacer structure 160 can separate gate structure 110 from S/D region 124. For example, inner spacer structure 160 can be formed at gate structure 110's opposite sides along FET 101's channel direction (e.g., along the x-direction) to separate gate structure 110 from S/D region 124. In some embodiments, inner spacer structure 160 can be formed between two vertically (e.g., in the z-direction) adjacent channel regions 122. Inner spacer structure 160 can further have a front surface 162F proximate to gate structure 110. In some embodiments, front surface 162F can be substantially coplanar with gate structure 110. In some embodiments, front surface 162F can be a substantially planar surface or a curved surface. Inner spacer structure 160 can further have a back surface 162B proximate to S/D region 124. In some embodiments, back surface 162B can be substantially coplanar with S/D region 124. In some embodiments, back surface 162B can be a substantially planar surface or a curved surface. In some embodiments, back surface 162B can be an indented surface with respect to inner spacer structure 160's vertical (e.g., in the z-direction) adjacent channel region 122's side surface 122S. Inner spacer structure 160 can be made of any suitable insulating material, such as a low-k dielectric material, to electrically separate gate structure 110 from S/D region 124. In some embodiments, inner spacer structure 160 can be made of silicon nitride, silicon oxynitride (SiON), silicon oxycarbide (SiOC), silicon carbonitride (SiCN), silicon oxycarbonitride (SiOCN), and silicon oxynitridecarbide (SiONC). Based on the disclosure herein, other materials for inner spacer structure 160 are within the spirit and scope of this disclosure.

Figure 3:
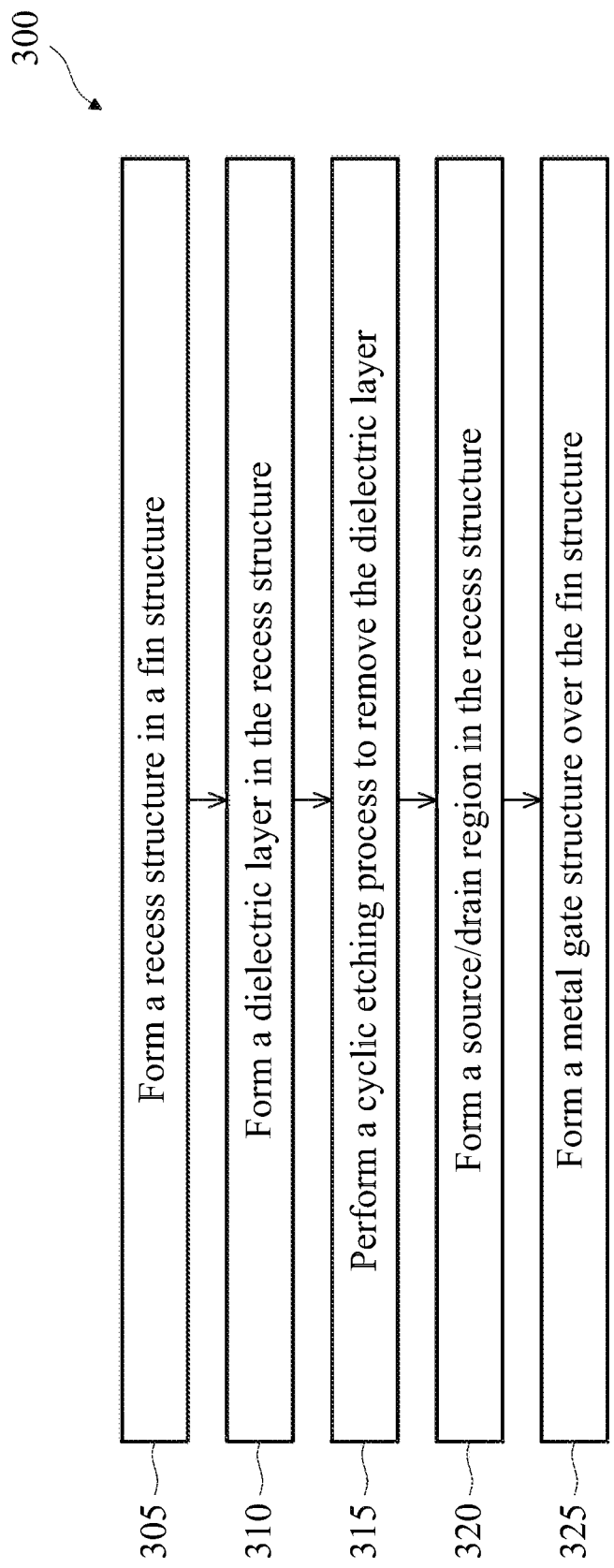
FIG. 3 is a flow diagram of a method for fabricating a semiconductor device, according to some embodiments.
Figure 4:
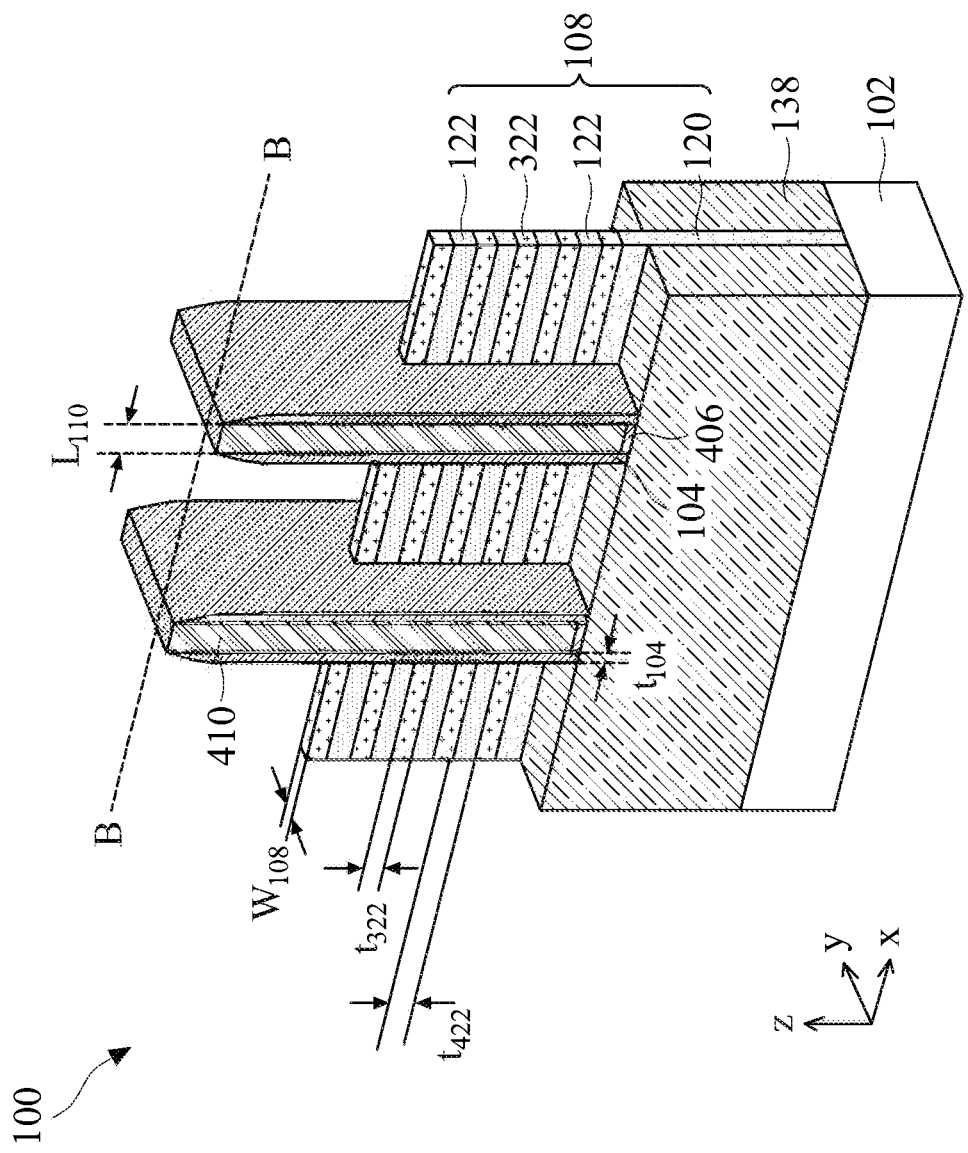
FIG. 4 is an isometric view of a semiconductor device at a stage of its fabrication process, according to some embodiments.
Figure 8:
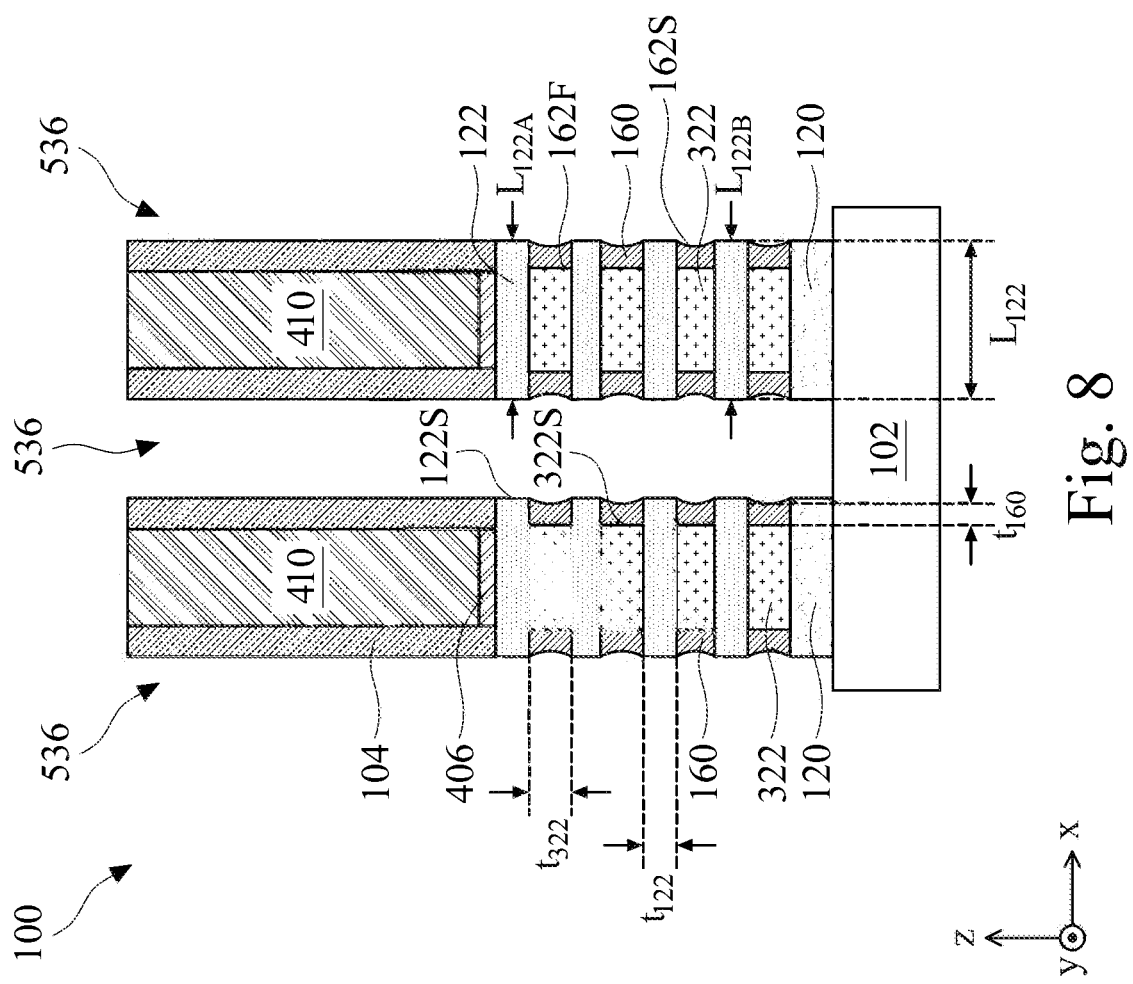
Figure 9:
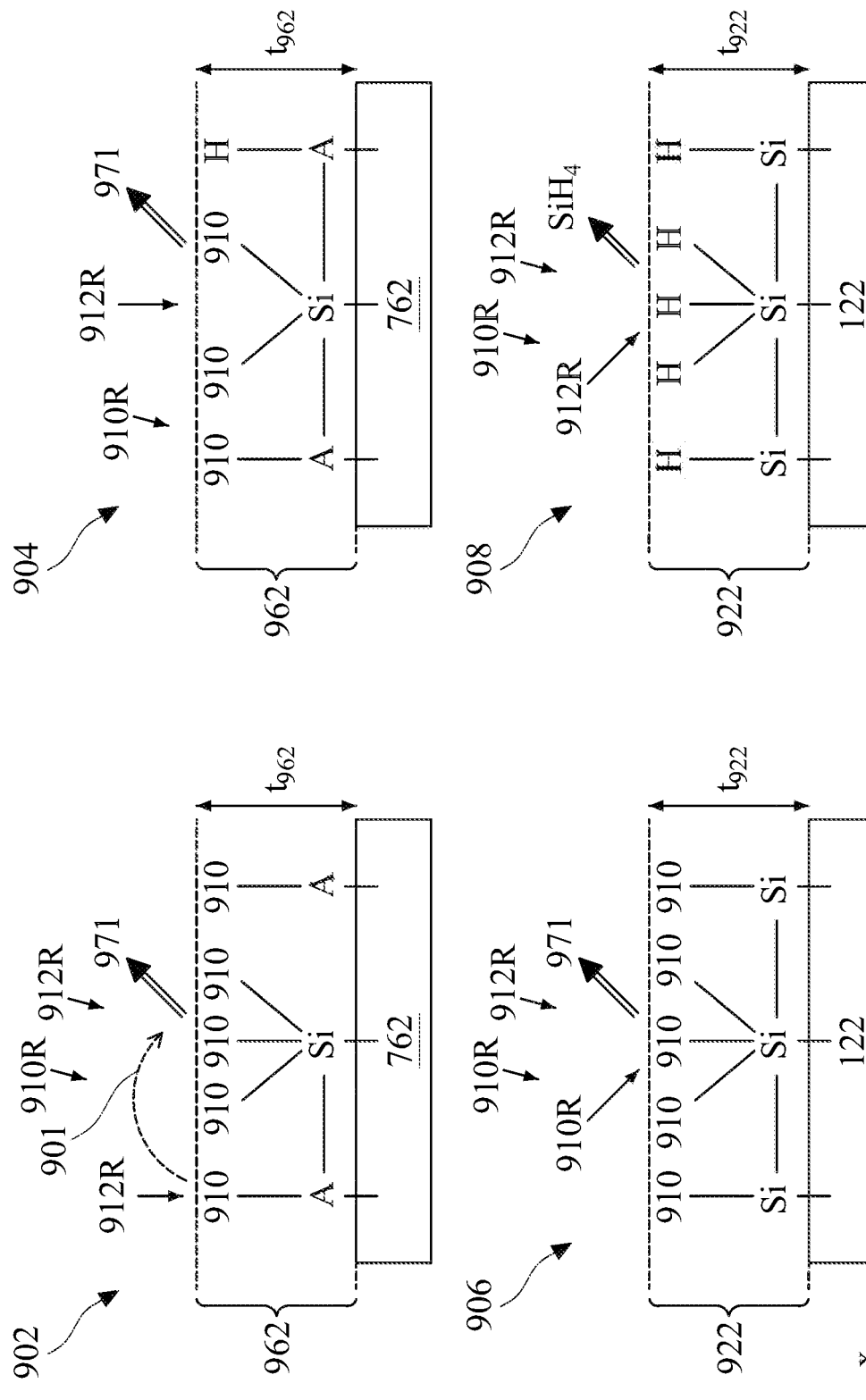
FIGS. 9 and 10 illustrate various scenarios of an etching process for fabrication of a semiconductor device, according to some embodiments.
Figure 10:
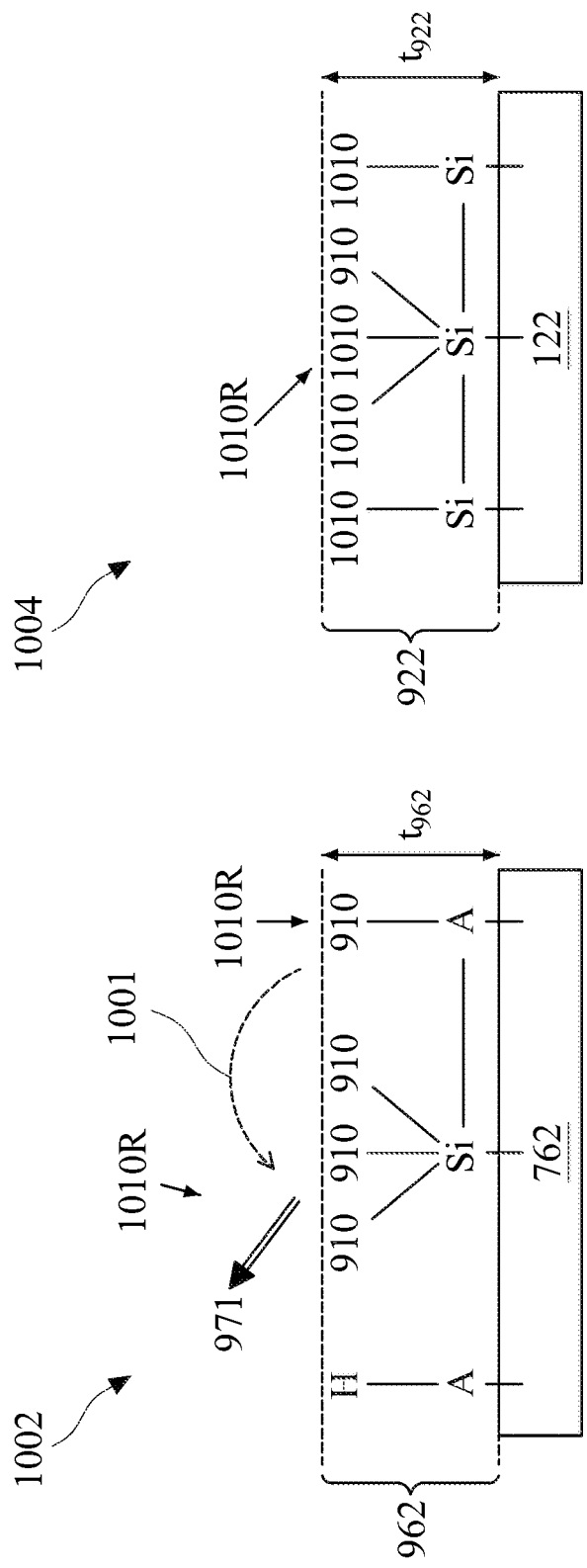

FIG. 3 is a flow diagram of a method 300 for fabricating semiconductor device 100, according to some embodiments. For illustrative purposes, the operations illustrated in FIG. 3 will be described with reference to the example fabrication process for fabricating semiconductor device 100 as illustrated in FIGS. 1 and 2. FIG. 4 illustrates an isometric view of semiconductor device 100 at a stage of its fabrication, according to some embodiments. FIGS. 5-8 and 11-14 illustrate cross-sectional views along line B-B of structure of FIG. 4 at various stages of its fabrication, according to some embodiments. FIGS. 9 and 10 illustrate various scenarios of an etching process to form inner spacer structure 160 in method 300, according to some embodiments. Operations can be performed in a different order or not performed depending on specific applications. Method 300 may not produce a complete semiconductor device 100. Accordingly, it is understood that additional processes can be provided before, during, and/or after method 300, and that some other processes may be briefly described herein. Further, the discussion of elements in FIGS. 1, 2, and 4-14 with the same annotations applies to each other, unless mentioned otherwise.

Referring to FIG. 3, in operation 305, a recess structure is formed in a fin structure. For example, a recess structure 536 (shown in FIG. 5) can be formed in fin structure 108 (shown in FIG. 4) with reference to FIGS. 4 and 5. The process of forming recess structure 536 can include (i) forming fin structures 108 (shown in FIG. 4) over substrate 102; (ii) forming STI region 138 (shown in FIG. 4) over the etched substrate 102 using a deposition process and an etch back process; (iii) forming sacrificial gate structures 410 (shown in FIG. 4) with length $L_{110}$ over fin structures 108; and (iv) removing fin structures 108 through sacrificial gate structures 410 to form recess structure 536.

Referring to FIG. 4, the process of forming fin structures 108 can include (i) providing substrate 102; (ii) epitaxially growing channel regions 122 and sacrificial layers 322 over substrate 102; and (iii) etching channel regions 122, sacrificial layers 322, and substrate 102 through a patterned mask layer (not shown in FIG. 4) using an etching process.

Sacrificial layer 322 can be made of materials different from channel region 122 and similar to (e.g., lattice mismatch within 5%) substrate 102. In some embodiments, sacrificial layer 322 can be made of SiGe, and channel region 122 can be made of Si. In some embodiments, sacrificial layer 322 and channel region 122 can be made of SiGe with different atomic percentage of Ge from each other. Channel region 122 and sacrificial layer 322 can have suitable thicknesses $t_{422}$ and $t_{322}$, respectively. In some embodiments, each of thicknesses $t_{422}$ and $t_{322}$ can be from about 5 nm to about 10 nm. Channel region 122 and sacrificial layer 322 can be epitaxially grown using any suitable epitaxial growth process, such as a chemical vapor deposition (CVD) process, a low pressure CVD (LPCVD) process, a rapid thermal CVD (RTCVD) process, a metal-organic CVD (MOCVD) process, an atomic layer CVD (ALCVD) process, an ultrahigh vacuum CVD (UHVCVD) process, a reduced pressure CVD (RPCVD) process, a molecular beam epitaxy (MBE) process, a cyclic deposition-etch (CDE) process, and a selective epitaxial growth (SEG) process. Based on the disclosure herein, other materials, thicknesses, and epitaxial growth processes for channel region 122 and sacrificial layer 322 are within the spirit and scope of this disclosure.

The etching process for removing channel region 122, sacrificial layer 322, and substrate 102 can include a dry etching process or a wet etching process to define fin structure 108 with any suitable width $W_{108}$, such as from about 5 nm to about 50 nm. In some embodiments, the dry etching process can include using any suitable etchant, such as an oxygen-containing gas, a fluorine-containing gas, a chlorine-containing gas, and a bromine-containing gas, and the wet etching process can include etching in any suitable wet etchant, such as diluted hydrofluoric acid, potassium hydroxide solution, ammonia, and nitric acid. Based on the disclosure herein, other widths and etching processes for fin structure 108 are within the spirit and scope of this disclosure.

The deposition process for forming STI region 138 can include any suitable growth process, such as a physical vapor deposition (PVD) process, a CVD process, a high-density-plasma (HDP) CVD process, a flowable CVD (FCVD) process, and an atomic layer deposition (ALD) process. The etch back process for forming STI region 138 can include a dry etching process, a wet etching process, or a polishing process, such as chemical vapor deposition (CMP) process. Based on the disclosure herein, other processes for forming STI region 138 are within the spirit and scope of this disclosure.

The process of forming sacrificial gate structure 410 can include (i) blanket depositing a dielectric layer 406 with a suitable thickness, such as from about 1 nm to about 5 nm, over fin structures 108 using a suitable deposition process, such as a CVD process, a PVD process, and an ALD process; (ii) blanket depositing a polysilicon layer (not shown in FIG. 4) and a hard mask layer (not shown in FIG. 4) over dielectric layer 406 using a suitable deposition process, such as a CVD process, a PVD process, and an ALD process; (iii) removing dielectric layer 406, the polysilicon layer and the hard mask layer through a patterned mask layer (not shown in FIG. 4) using an etching process; and (iv) forming gate spacers 104 with a suitable thickness $t_{104}$, such as from about 5 nm to about 15 nm, over the polysilicon layer's side surfaces and/or over fin structure 108's side surfaces using a suitable deposition process and an etching process. Based on the disclosure herein, other processes for forming gate structures 410 are within the spirit and scope of this disclosure.

Figure 5:
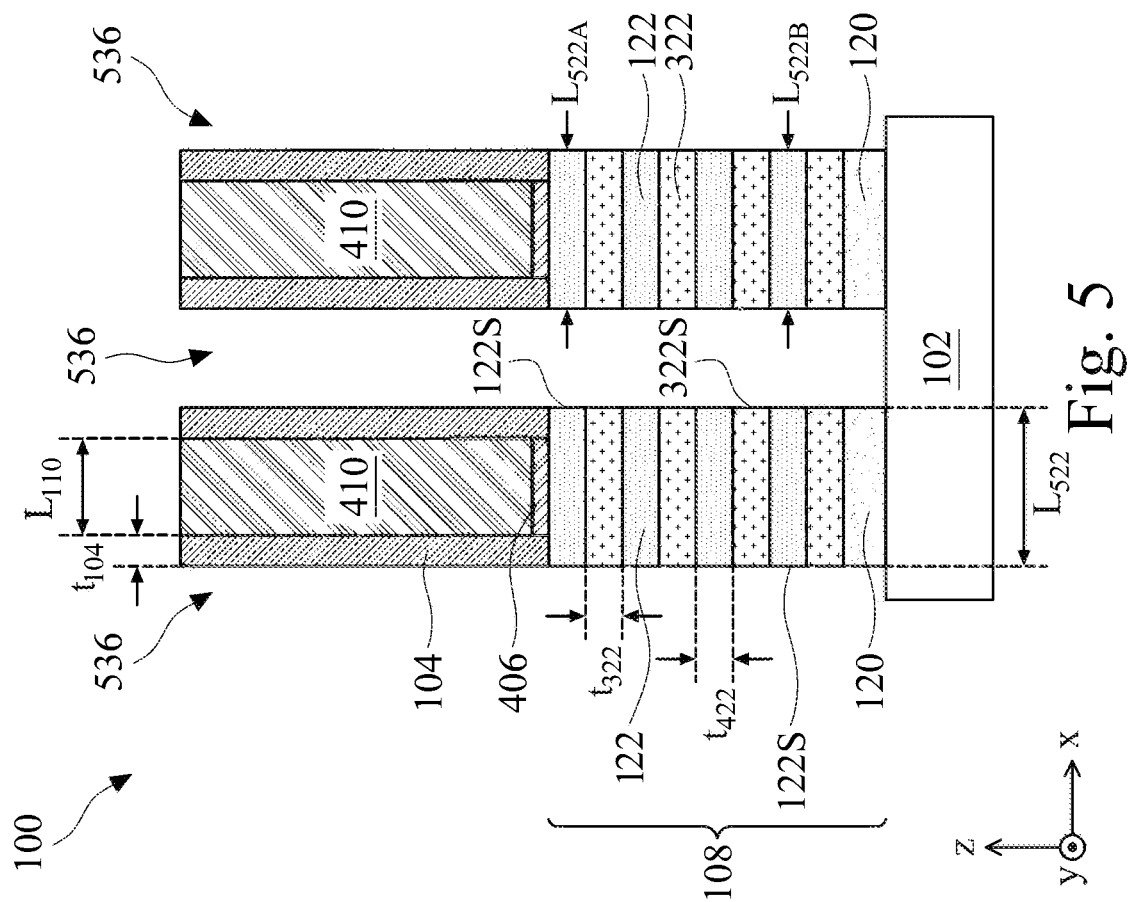
FIGS. 5-8 are cross-sectional views of a semiconductor device at various stages of its fabrication process, according to some embodiments.
Figure 6:
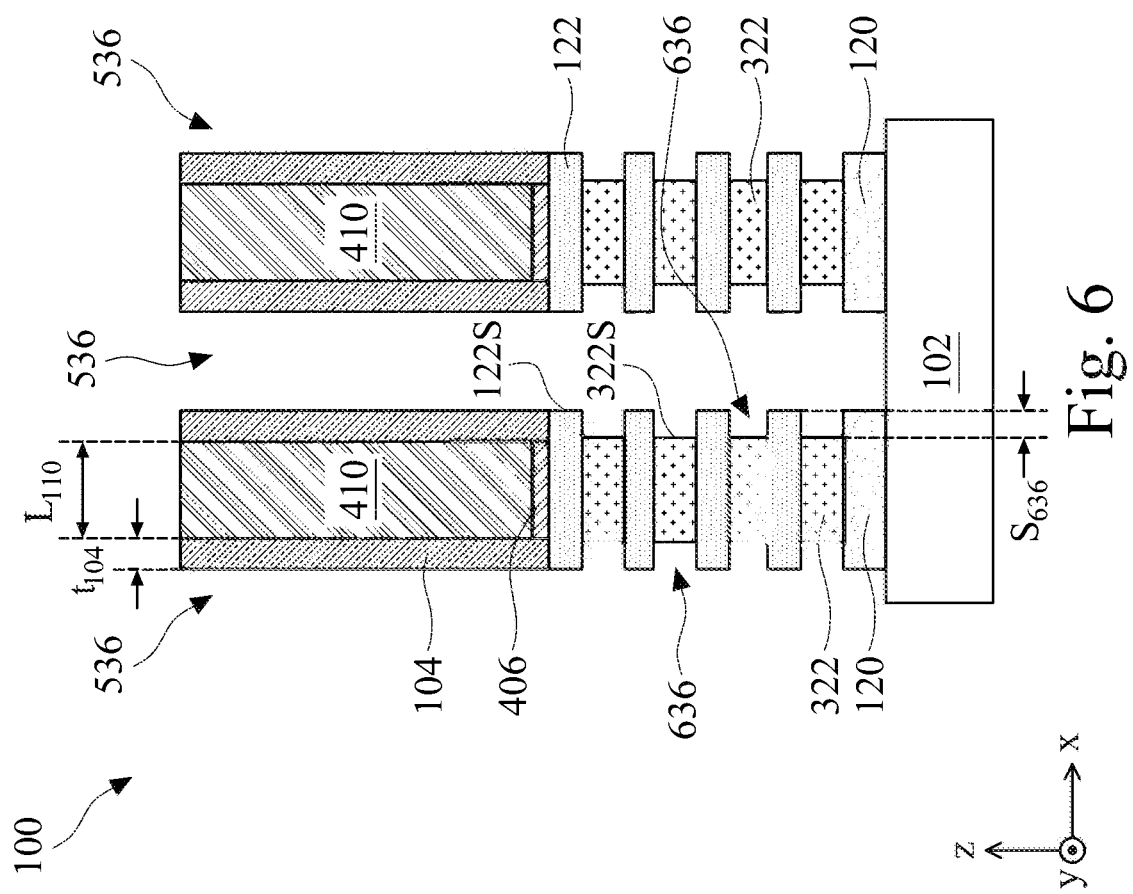
Figure 7:
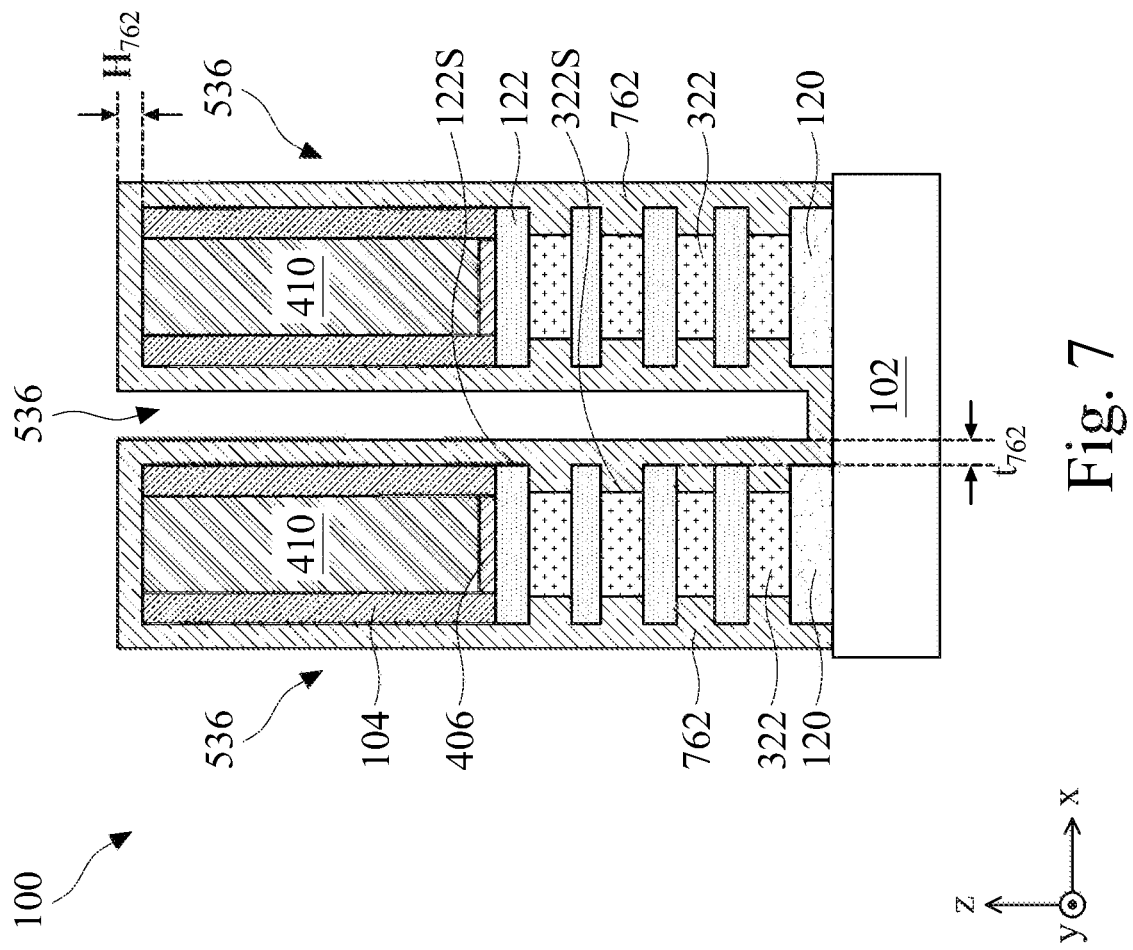

Referring to FIG. 5, after forming sacrificial gate structure 410, recess structure 536 can be formed by removing channel regions 122, sacrificial layers 322, and substrate 102 through sacrificial gate structures 410 and gate spacers 104 using an etching process. The etching process can include a dry etching process or a wet etching process. In some embodiments, the etching process can be a time-etching process. In some embodiments, the dry etching process can include using any suitable etchant, such as an oxygen-containing gas, a fluorine-containing gas, a chlorine-containing gas, and a bromine-containing gas, and the wet etching process can include etching in any suitable wet etchant, such as diluted hydrofluoric acid, potassium hydroxide solution, ammonia, and nitric acid. As shown in FIG. 5, the resulting recess structure 536 can expose fin structure 108's side surface, such as exposing sacrificial layer 322's side surface 322S and exposing channel region 122's side surface 122S. Further, the resulting recess structure 536 can expose gate spacers 104's side surfaces. Further, the resulting recess structure can define a suitable channel region 122's length $L_{522}$, such as from about 10 nm to about 50 nm. In some embodiments, length $L_{522}$ can be substantially equal to the sum of length $L_{110}$ and twice of thickness $t_{104}$. In some embodiments, an upper channel region 122's length $L_{522}$ (e.g., length $L_{522A}$) can be substantially equal to a lower channel region 122's length $L_{522}$ (e.g., length $L_{522B}$). In some embodiments, a standard deviation of the upper channel region 122's length $L_{522}$ (e.g., length $L_{522A}$) and the lower channel region 122's length $L_{522}$ (e.g., length $L_{522B}$) can be less than about 1 nm.

Referring to FIG. 3, in operation 310, a dielectric layer is formed in the recess structure. For example, dielectric layer 762 (shown in FIG. 7) can be formed in fin structure 108 of FIG. 5. The process of forming dielectric layer 762 can include forming recess structures 636 (shown in FIG. 6) in FIG. 5's sacrificial layers 322 with a suitable etching depth $S_{636}$, such as from about 2 nm to about 10 nm, using a selective etching process that can selectively etch sacrificial layer 322 from channel region 122. In some embodiments, etching depth $S_{636}$ can be less than or substantially equal to gate spacer 104's thickness $t_{104}$. In some embodiments, the selective etching process can form a curved side surface 322S exposed by recess structure 636. The process of forming dielectric layer 762 can further include blanket depositing dielectric layer 762 in recess structure 436 and in recess structures 636 using a deposition process, such as a CVD process, a PVD process, and an ALD process. The deposited dielectric layer 762 can cover fin structure 108's side surface, such as covering sacrificial layer 322's side surface 322S and covering channel region 122's side surface 122S. In some embodiments, the deposited dielectric layer 762 can be a substantially conformal dielectric layer covering fin structure 108's top and side surfaces. For example, dielectric layer 762 can have a thickness $H_{762}$ over sacrificial gate structure 410 and a thickness $t_{762}$ over channel region 122's side surface 122S, where thickness $H_{762}$ can be substantially equal to thickness $t_{762}$. In some embodiments, the deposited dielectric layer 762 can substantially fill recess structure 636. In some embodiments, the deposited dielectric layer 762 can have two opposite side surfaces horizontally (e.g., in the x-direction) separated from one another in recess structure 536.

Referring to FIG. 3, in operation 315, a cyclic etching process is performed to remove the dielectric layer. For example, as shown in FIG. 8, a portion of dielectric layer 762 (e.g., from FIG. 7) that is over channel region 122's side surface 122S can be removed to define inner spacer structure 160 by performing the cyclic etching process (shown in FIGS. 9 and 10) with reference to FIGS. 8-10. The cyclic etching process can be an oxygen-free dry etching process to define inner spacer structure 160 by selectively etching dielectric layer 762 of FIG. 7 over channel region 122. In some embodiments, the cyclic etching process does not apply oxygen-contained etchants (e.g., etchants' chemical formula that does not include oxygen) to etch dielectric layer 762. In some embodiments, the cyclic etching process can include one or more cycles of a radical etching process that can laterally and selectively etch dielectric layer 762 over channel region 122's surface 122S to define inner spacer structure 160. In some embodiments, the cyclic etching process can etch dielectric layer 762 at a first etching rate and etch channel region 122 at a second etching rate, where a ratio of the first etching rate to the second etching rate can be from about 3 to about 50, from about 5 to about 50, from about 5 to about 40, from about 5 to about 30, or from about 5 to about 20. If the ratio is below the above-noted lower limits, the cyclic etching process may damage channel region 122, thus reducing the yield of semiconductor device 100. If the ratio is beyond the above-noted upper limits, the cyclic etching process may consume more process gases, thus increasing a manufacturing cost of semiconductor device 100. In some embodiments, the above-noted lower and upper limits are determined based on the activation discrepancies (caused at least by the choice of processing gas species; discussed below with reference to FIGS. 9 and 10) in the cyclic etching process. In some embodiments, since the cyclic etching process can selectively etch dielectric layer 762 over channel region 122, the resulting channel region 122's thickness $t_{122}$ after the cyclic etching process can be substantially equal to thickness $t_{422}$ defined at operation 305 (shown in FIG. 5). In some embodiments, since the cyclic etching process can selectively etch dielectric layer 762 over channel region 122, the resulting channel layer 122's length $L_{122}$ after the cyclic etching process can be substantially equal to length $L_{522}$ defined at operation 305 (shown in FIG. 5). In some embodiments, after the cyclic etching process, an upper channel region 122's length $L_{122}$ (e.g., length $L_{122A}$) can be substantially equal to a lower channel region 122's length $L_{122}$ (e.g., length $L_{122B}$). In some embodiments, after the cyclic etching process, a standard deviation of the upper channel region 122's length $L_{122}$ (e.g., length $L_{122A}$) and the lower channel region 122's length $L_{122}$ (e.g., length $L_{122B}$) can be less than about 1 nm.

Referring to FIG. 9, each cycle of the cyclic etching process can include a first dry etching process. The process of performing the first dry etching process can include (i) providing a first processing gas that contains a first halogen element; and (ii) generating particle beams 910R (e.g., radicals or ions) by performing an excitation process, a disassociation process, and/or an ionization process on the first processing gas. In some embodiments, the first processing gas can include nitrogen trifluoride ($NF_3$), fluorine gas ($F_2$), carbon tetrafluoride ($CF_4$), or fluoroform ($CHF_3$), where the respective first halogen element of the first processing gas can be a fluorine element (F) and the respective particle beams 910R can contain fluorine-based radicals and/or fluorine-based plasmas. In some embodiments, particle beams 910R can be substantially made of radicals (e.g., does not contain ions).

Particle beams 910R can adsorb on dielectric layer 762 to form an interfacial layer 962 over dielectric layer 762. For example, as shown in FIG. 9's scenario 902, particle beams 910R can adsorb on dielectric layer 762's silicon sites to form bonding Si-910 (e.g., Si—F bonding) in interfacial layer 962, where element 910 can represent the first halogen element (e.g., fluorine element, F) of the first processing gas. Particle beams 910R can further adsorb on dielectric layer 762's element A's sites to form bonding A-910 (e.g., N—F bonding) in interfacial layer 962. In some embodiments, element A in dielectric 762 can include a nitrogen element, a carbon element, or an oxygen element. In some embodiments, dielectric layer 762 can be a low-k dielectric material (e.g., SiCN) that contains a nitrogen element and particle beams 910R can be fluorine-based radicals, where the respective bonding Si-910 can be a Si—F bonding and the respective bonding A-910 can be a N—F bonding. The subsequent incoming particle beams 910R during the first etching process can further react with bonding Si-910 to form a volatile byproduct 971. Volatile byproduct 971 can then be evaporated from dielectric layer 762's surface, thus reducing dielectric layer 762's volume (e.g., dielectric layer 762 can be etched by the first dry etching process under scenario 902). In some embodiments, particle beams 910R can be fluorine-based radicals, where the respective volatile byproduct 971 can be silicon fluoride ($SiF_4$).

In some embodiments, the process of performing the first dry etching process of each cycle of the cyclic etching process can further include (i) providing another processing gas that contains element hydrogen (H); and (ii) generating particle beams 912R (e.g., hydrogen-contained radicals or hydrogen-contained plasmas) by performing an excitation process, a dislocation process, and/or an ionization process on the other processing gas. In some embodiments, the other processing gas that contains element hydrogen can include hydrogen gas (H2), phosphine ($PH_3$), ammonia ($NH_3$), or methane ($CH_4$). As shown in FIG. 9's scenario 902, particle beams 912R can interact with A-910 bonding (e.g., N—F bonding) to migrate (e.g., represented by arrow 901) element 910 (e.g., F element) from element A sites (e.g., nitrogen sites) to adjacent silicon sites (e.g., the adjacent Si-910 bonding). The migrated elements 910 (e.g., F element) can therefore react with bonding Si-910 (e.g., Si—F bonding) to form volatile byproduct 971, thus enhancing the first dry etching process's etching rate of etching dielectric layer 762. In some embodiments, as shown in FIG. 9's scenario 904, particle beams 912R can adsorb on dielectric layer 762's element A's sites to form bonding A-H (e.g., N—H bonding) in interfacial layer 962. By reacting element A's sites with particle beams 912R, the reaction rate and/or the adsorption rate of particle beams 910R with dielectric layer 762's silicon site can be increased to form volatile byproduct 971, thus enhancing the first dry etching process's etching rate of etch dielectric layer 762.

In some embodiments, the first dry etching process of each cycle of the cyclic etching process may slightly etch channel region 122. For example, as shown in FIG. 9's scenario 906, particle beams 910R may adsorb on channel region 122's silicon sites by forming bonding Si-910 (e.g., Si—F bonding) in interfacial layer 922 over channel region 122. The subsequent incoming particle beams 910R (e.g., F radicals) may further react with bonding Si-910 (e.g., Si—F bonding) to form volatile byproduct 971 to etch channel region 122. In some embodiments, as shown in FIG. 9's scenario 908, particle beams 912R (e.g., H radicals) may adsorb on channel region 122's silicon sites by forming bonding Si—H bonding in interfacial layer 922 over channel region 122. The subsequent generated particle beams 912R may further react with Si—H bonding to form volatile $SiH_4$ to etch channel region 122. Comparing scenarios 902 and 904 (e.g., etching dielectric layer 762) to scenarios 906 and 908 (e.g., etching channel region 122), particle beams 912R can boost the adsorption rate of the element 910 (e.g., the first fluorine element, such as F, from the first processing gas) on dielectric layers 762's silicon site. Accordingly, the first dry etching process can etch dielectric layer 762 at a greater etching rate than etching channel region 122. In some embodiments, an activation energy discrepancy between scenarios 902/904 and scenarios 906/908 can be less than about 0.1 eV, such that the first dry etching process can etch dielectric layer 762 at an etching rate greater than or substantially equal to an etching rate of etching channel region 122. In some embodiments, a ratio of an etching rate of etching dielectric layer 762 via the first dry etching process to an etching rate of etching channel region 122 via the first dry etching process can be from about 0.5 to about 5 or from about 1 to about 3. If the ratio is below the above-noted lower limits, the first dry etching process may cause extra damages on channel region 122, thus reducing the yield of semiconductor device 100. If the ratio is beyond the above-noted upper limits, the first dry etching process may consume more process gases, thus increasing a manufacturing cost of semiconductor device 100. In some embodiments, the above-noted upper and lower limits are determined by the above-noted activation energy's discrepancy between scenarios 902/904 and scenarios 906/908.

Referring to FIG. 10, each cycle of the cyclic etching process can further include a second dry etching process subsequently followed by the first dry etching process. The process of performing the second dry etching process can include (i) providing a second processing gas that contains a second halogen element; and (ii) generating particle beams 1010R (e.g., radicals or plasmas) by performing an excitation process, a disassociation process, and/or an ionization process on the second processing gas. In some embodiments, particle beams 1010R can be substantially made of radicals (e.g., does not contain ions). The second halogen element associated with the second dry etching process can be different from the first halogen element associated with the first dry etching process. In some embodiments, the second halogen element's atomic mass can be greater than the first halogen element's atomic mass. For example, the second halogen element associated with the second dry etching process can be a chlorine element (Cl), and the first halogen element associated with the first dry etching process can be a fluorine element (F). The second processing gas that contains the second halogen element can be free from containing the first halogen element (e.g., the second processing gas does not contain the first halogen element). For example, the first halogen element associated with the first dry etching process can be a fluorine element (F), where the second processing gas can be fluorine-free (e.g., the second processing gas's chemical formula does not contain fluorine element). In some embodiments, the second processing gas can include chlorine gas ($Cl_2$), silicon tetrachloride ($SiCl_4$), or boron trichloride ($BCl_3$), where the second halogen element of the second processing gas can be a chlorine element (Cl) and the respective particle beams 1010R can contain chlorine-based radicals and/or chlorine-based plasmas. As shown in FIG. 10's scenario 1002, particle beams 1010R (e.g., Cl radicals) can react with dielectric layer 762's bonding A-910 (e.g., N—F bonding) formed by the first dry etching process to migrate (e.g., represented by arrow 1001) element 910 (F elements; the first halogen element from element A sites (e.g., nitrogen sites) to adjacent silicon sites (e.g., the adjacent Si—F bonding). The migrated elements 910 (F elements) can therefore react with bonding Si-910 (Si—F bonding) to form volatile byproduct 971 (e.g., $SiF_4$), thus causing the etching of dielectric layer 762 during the second dry etching process. In some embodiments, particle beams 1010R (e.g., Cl radicals) can be adsorbed on dielectric layer 762 to form Si-1010 bonding (Si—Cl bonding; not shown in FIG. 10's scenario 1002) or A-1010 bonding (N—Cl bonding; not shown in FIG. 10), where the subsequent generated particle beams 1010R during the second etching process can further react with bonding Si-1010 and bonding A-1010 with a sufficient low activation energy (e.g., less than about 0.5 eV or less than about 0.1 eV) to cause the etching of dielectric layer 762.

Further, the second dry etching process can have a negligible etching rate of etching channel region 122. For example, as shown in FIG. 10's scenario 1004, particle beams 1010R may adsorb on channel region 122's silicon sites or react with Si-910 (e.g., Si—F bonding formed by the first dry etching process). The adsorption of particle beams 1010R on channel region 122 can form bonding Si-1010 (e.g., Si—Cl bonding) in interfacial layer 922 over channel region 122. The subsequent generated particle beams 1010R may further react with bonding Si-1010 with an activation energy greater than scenario 1002's activation energy. In some embodiments, scenario 1004's activation energy can be greater than scenario 1002's activation energy by at least about 0.1 eV, such as from about 0.1 eV to about 0.5 eV. Accordingly, the second dry etching process can selectively etch dielectric layer 762 (shown in scenario 1002) over channel region 122 (shown in scenario 1004). For example, a ratio of an etching rate of etching dielectric layer 762 via the second dry etching process to an etching rate of etching channel region 122 via the second dry etching process can be from about 5 to about 50, from about 5 to about 40, from about 5 to about 30, or from about 5 to about 20. If the ratio is below the above-noted lower limits, the second dry etching process may cause extra damages on channel region 122, thus reducing the yield of semiconductor device 100. If the ratio is beyond the above-noted upper limits, the second dry etching process may consume more process gases, thus increasing a manufacturing cost of semiconductor device 100. In some embodiments, the above-noted upper and lower limits are determined by the above-noted activation energy's discrepancy between scenarios 1002 and 1004.

Further, the second dry etching process can provide a greater etching selectivity to etch dielectric layer 762 over channel region 122 than to the first dry etching process. Since the activation energy difference (e.g., less than about 0.1 eV) between scenarios 902/904 and scenarios 906/908 can be less than that (e.g., greater than about 0.1 eV) between scenario 1002 and scenario 1004, the second dry etching process can provide a greater etching selectivity to etch dielectric layer 762 over channel region 122 than to the first dry etching process. In some embodiments, a ratio of the second dry etching process's etching selectivity (e.g., a ratio of an etching rate of etching dielectric layer 762 using the second dry etching process to an etching rate of etching channel region 122 using the second dry etching process) to the first dry etching process's etching selectivity (e.g., a ratio of an etching rate of etching dielectric layer 762 using the first dry etching process to an etching rate of etching channel region 122 using the first dry etching process) can be from about 1 to about 20, from about 2 to about 20, from about 2 to about 15, from about 2 to about 10, or from about 2 to about 5. If the ratio is below the above-noted lower limits, the first dry etching process may cause extra damages on channel region 122, thus reducing the yield of semiconductor device 100. If the ratio is beyond the above-noted upper limits, the second dry etching process may consume more process gases, thus increasing a manufacturing cost of semiconductor device 100. In some embodiments, the above-noted upper and lower limits are determined by (i) the activation energy's discrepancy between scenarios 902/904 and scenarios 906/908 and (ii) the activation energy's discrepancy between scenario 1002 and scenario 1004.

In some embodiments, since the activation energy difference between scenarios 902/904 and scenarios 906/908 can be less than that between scenario 1002 and scenario 1004, the second dry etching process can provide a lower etching rate to etch channel region 122 than the first dry etching process. In some embodiments, a ratio of an etching rate of etching channel region 122 via the second dry etching process to an etching rate of etching channel region 122 via the first dry etching process can be from about 0.05 to about 1, from about 0.05 to about 0.8, from about 0.05 to about 0.6, from about 0.05 to about 0.4, from about 0.05 to about 0.2, or from about 0.05 to about 0.1. If the ratio is below the above-noted lower limits, the first dry etching process may cause extra damages on channel region 122, thus reducing the yield of semiconductor device 100. If the ratio is beyond the above-noted upper limits, the second dry etching process may cause extra damages on channel region 122, thus reducing the yield of semiconductor device 100. In some embodiments, the above-noted upper and lower limits are determined by (i) the activation energy's discrepancy between scenarios 902/904 and scenarios 906/908 and (ii) the activation energy's discrepancy between scenario 1002 and scenario 1004.

In some embodiments, since the activation energy difference between scenario 902 and scenario 1002 can be substantially equal to each other, the first and second dry etching processes can etch dielectric layer 762 with substantially equal etching rates to one another.

In some embodiments, since the second dry etching process's etching selectivity can be greater than the first dry etching process's etching selectivity, it is desirable to provide less radio frequency (RF) power for the first dry etching process than for the second dry etching process to increase an overall etching selectivity of the cyclic etching process to etch dielectric layer 762 over channel region 122. In some embodiments, the process of generating particle beams 910R and 1010R for the first and second dry etching processes can include providing first and second RF powers, respectively, where a ratio of the first RF power to the second RF power can be from about 0.05 to about 1, from about 0.05 to about 0.8, from about 0.05 to about 0.6, from about 0.05 to about 0.4, or from about 0.05 to about 0.2. If the ratio of the first RF power to the second RF power is above these upper limits, the overall cyclic etching process may provide an insufficient etching selectivity to etch dielectric layer 762 from channel region 122, because the first dry etching process may have an inferior etching selectivity to the second dry etching process as previously discussed. If the ratio of the first RF power to the second RF power is below the above-noted lower limit, the first dry etching process may not have sufficient energy to form particle beams 910R and/or 912R.

In some embodiments, since the second dry etching process's etching selectivity can be greater than the first dry etching process's etching selectivity, it is desirable to perform a lower etching time duration for the first dry etching process than for the second dry etching process to increase an overall etching selectivity of the cyclic etching process to etch dielectric layer 762 over channel region 122. In some embodiments, the first and second dry etching processes can be performed for a first and second etching time durations, respectively, where a ratio of the first etching time duration to the second etching time duration can be from about 0.05 to about 1, from about 0.05 to about 0.8, from about 0.05 to about 0.6, from about 0.05 to about 0.4, or from about 0.05 to about 0.2. If the ratio of the first time duration to the second time duration is above these upper limits, the overall cyclic etching process may provide an insufficient etching selectivity to etch dielectric layer 762 from channel region 122, because the first dry etching process may have an inferior etching selectivity to the second dry etching process as previously discussed. If the ratio of the first time duration to the second time duration is below the above-noted lower limit, the first dry etching process may not have sufficient time duration to form particle beams 910R and/or 912R.

In some embodiments, since the second dry etching process's etching selectivity can be greater than the first dry etching process's etching selectivity, it is desirable to provide the first processing gas with a reduced flow rate for the first dry etching process and provide the second processing gas with an increased flow rate for the second dry etching process to increase an overall etching selectivity of the cyclic etching process to etch dielectric layer 762 over channel region 122. In some embodiments, the processes of performing the first and second dry etching processes can include providing the first and second processing gases with a first and second flow rates, respectively, where a ratio of the first flow rate to the second flow rate can be from about 0.05 to about 1, from about 0.05 to about 0.8, from about 0.05 to about 0.6, from about 0.05 to about 0.4, or from about 0.05 to about 0.2. If the ratio of the first flow rate to the second flow rate is above these upper limits, the overall cyclic etching process may provide an insufficient etching selectivity to etch dielectric layer 762 from channel region 122, because the first dry etching process may have an inferior etching selectivity to the second dry etching process as previously discussed. If the ratio of the first flow rate to the second flow rate is below the above-noted lower limit, the first dry etching process may not have sufficient processing gas to form particle beams 910R and/or 912R.

In some embodiments, since the second dry etching process's etching selectivity can be greater than the first dry etching process's etching selectivity, it is desirable to provide the first processing gas with a reduced dispensing time duration for the first dry etching process and provide the second processing gas with an increased dispensing time duration for the second dry etching process to increase an overall etching selectivity of the cyclic etching process to etch dielectric layer 762 over channel region 122. In some embodiments, the processes of performing the first and second dry etching processes can include providing the first and second processing gases with a first and second dispensing time durations, respectively, where a ratio of the first dispensing time duration to the second dispensing time duration can be from about 0.05 to about 1, from about 0.05 to about 0.8, from about 0.05 to about 0.6, from about 0.05 to about 0.4, or from about 0.05 to about 0.2. If the ratio of the first dispensing time duration to the second dispensing time duration is above these upper limits, the overall cyclic etching process may provide an insufficient etching selectivity to etch dielectric layer 762 from channel region 122, because the first dry etching process may have an inferior etching selectivity to the second dry etching process as previously discussed. If the ratio of the first dispensing time duration to the second dispensing time duration is below the above-noted lower limit, the first dry etching process may not have sufficient processing gas to form particle beams 910R and/or 912R.

In some embodiments. the first processing gas that contains the first halogen element can be free from containing the second halogen element (e.g., the first processing gas does not contain the second halogen element). For example, the second halogen element associated with the second dry etching process can be a chlorine element (Cl), where the first processing gas can be chlorine-free (e.g., the first processing gas's chemical formula does not contain chlorine).

After performing the second dry etching process, the cyclic etching process can perform the next cycle's first dry etching process to etch dielectric layer 762 and form bonding A-910 at interfacial layer 962 as previously discussed in FIG. 9, and subsequently perform the next cycle's second dry etching process to migrate the element A to selectively etch dielectric layer 762 over channel region 122 as previously discussed in FIG. 10.

In some embodiments, the cyclic etching process for defining inner spacer structure 160 can be an atomic layer etching process ("ALE mode"). In the ALE mode, the first dry etching process can form interfacial layers 962 and 922 as self-limited surface layers that (i) do not react with incoming particle beams 910R and 912R, and (ii) prevents the underlying dielectric layer 762 and channel region 122 from reacting with incoming particle beams 910R and 912R. Further, in the ALE mode, the second dry etching process can selectively etch interfacial layer 962 over the underlying dielectric layer 762 and/or channel region 122. In some embodiments, in the ALE mode, since interfacial layer 962 can be a self-limited surface layer, interfacial layer 962 can have a substantially constant thickness $t_{962}$, such as from about 0.1 nm to about 1.0 nm and from about 0.1 nm to about 0.5 nm, regardless the time duration of the first etching process. Similarly, in the ALE mode, since interfacial layer 922 can be a self-limited surface layer, interfacial layer 922 can have a substantially constant thicknesses $t_{922}$, such as from about 0.1 nm to about 1.0 nm and from about 0.1 nm to about 0.5 nm, regardless of the time duration of the first etching process. In some embodiments, in the ALE mode, each cycle of the cyclic etching process can etch a substantially equal thickness (e.g., substantially equal to thickness $t_{962}$) of dielectric layer 762.

Figure 11:
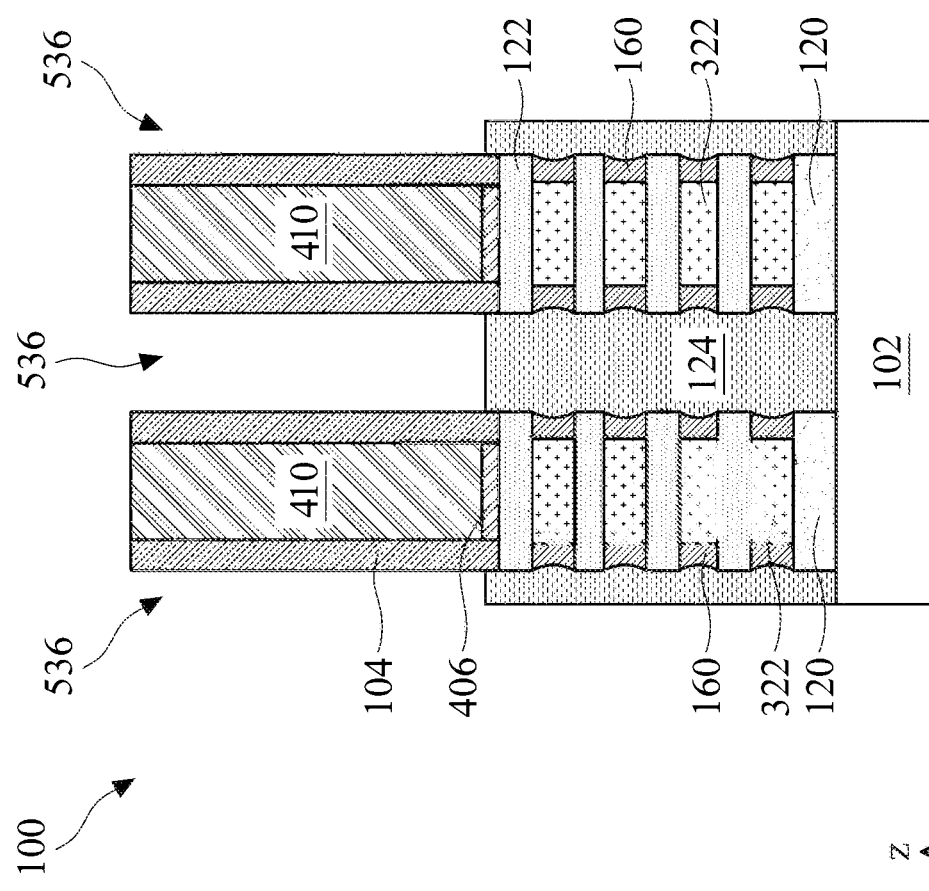
FIGS. 11-14 are cross-sectional views of a semiconductor device at various stages of its fabrication process, according to some embodiments.
Figure 12:
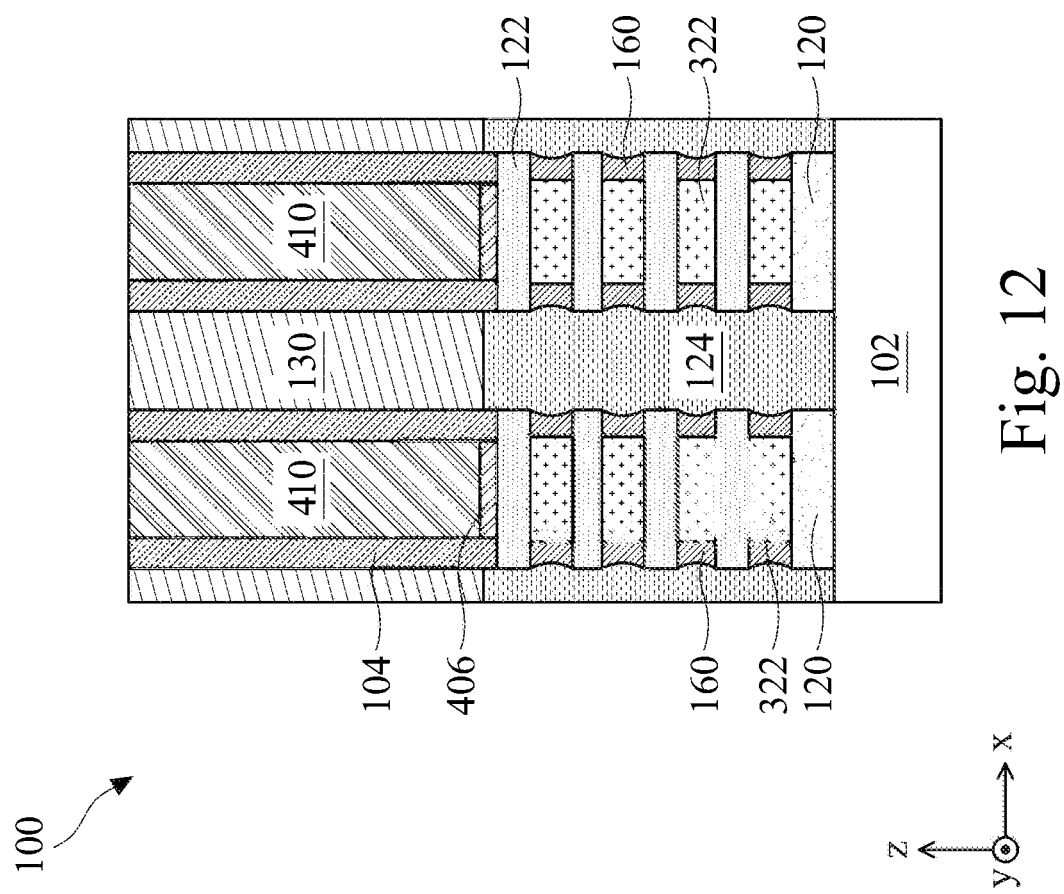

Referring to FIG. 3, in operation 320, a source/drain (S/D) region is formed in the recess structure. For example, as shown in FIG. 11, S/D region 124 can be formed in recess structures 536 and over inner spacer structures 160. The process of forming S/D region 124 can include epitaxially growing S/D region 124 in the structure of FIG. 8 using an epitaxial growth process, such as a CVD process, a LPCVD process, a RTCVD process, a MOCVD process, an ALCVD process, a UHVCVD process, a RPCVD process, an MBE process, a CDE process, and an SEG process. The epitaxial growth process can be performed using suitable precursors, such as silane ($SiH_4$), disilane ($Si_2H_6$), dichlorosilane (DCS), and germane ($GeH_4$). The epitaxial growth process can further include doping S/D region 124 using suitable dopant precursors, such as diborane ($B_2H_6$), boron trifluoride ($BF_3$), phosphine ($PH_3$), and arsine ($AsH_3$). Accordingly, the resulting S/D region 124 can be grown over and in contact with channel regions 122 under sacrificial gate structure 410 and gate spacers 104. The resulting S/D region 124 can be further grown over and in contact with inner spacer structures 160 that are vertically (e.g., in the z-direction) sandwiched by two vertical (e.g., in the z-direction) channel regions 122. Based on the disclosure herein, other epitaxial growth processes for forming S/D region 124 are within the spirit and scope of this disclosure.

Referring to FIG. 3, in operation 325, a metal gate structure is formed over the fin structure. For example, gate structure 110 (shown in FIG. 2) can be formed over fin structure 108. The process of forming gate structure 110 can include (i) forming ILD layer 130 (shown in FIG. 12) coplanarized with sacrificial gate structures 410 of FIG. 11 using a suitable deposition process, such as a PVD process and a CVD process, and a suitable etch back process, such as a chemical mechanical polishing (CMP) process; (ii) removing sacrificial layer 348 to form recess structures 1336 (shown in FIG. 13) to expose dielectric layer 406 using an etching process; and (iii) removing dielectric layer 406 to expose sacrificial layers 322 using an etching process. In some embodiments, the etching process for forming recess structure 1336 can include a dry etching process that uses chlorine, fluorine or bromine as gas etchants. In some embodiments, the etching process for forming recess structure 1336 can include a wet etching process that uses an ammonium hydroxide ($NH_4OH$), sodium hydroxide (NaOH), or potassium hydroxide (KOH) as wet etchants. In some embodiments, the etching process for removing dielectric layer 306 can include a dry etching process that uses chlorine, fluorine or bromine as gas etchants. In some embodiments, the etching process for removing dielectric layer 306 can include a wet etching process that uses an hydrogen fluoride (HF) as wet etchants.

Figure 13:
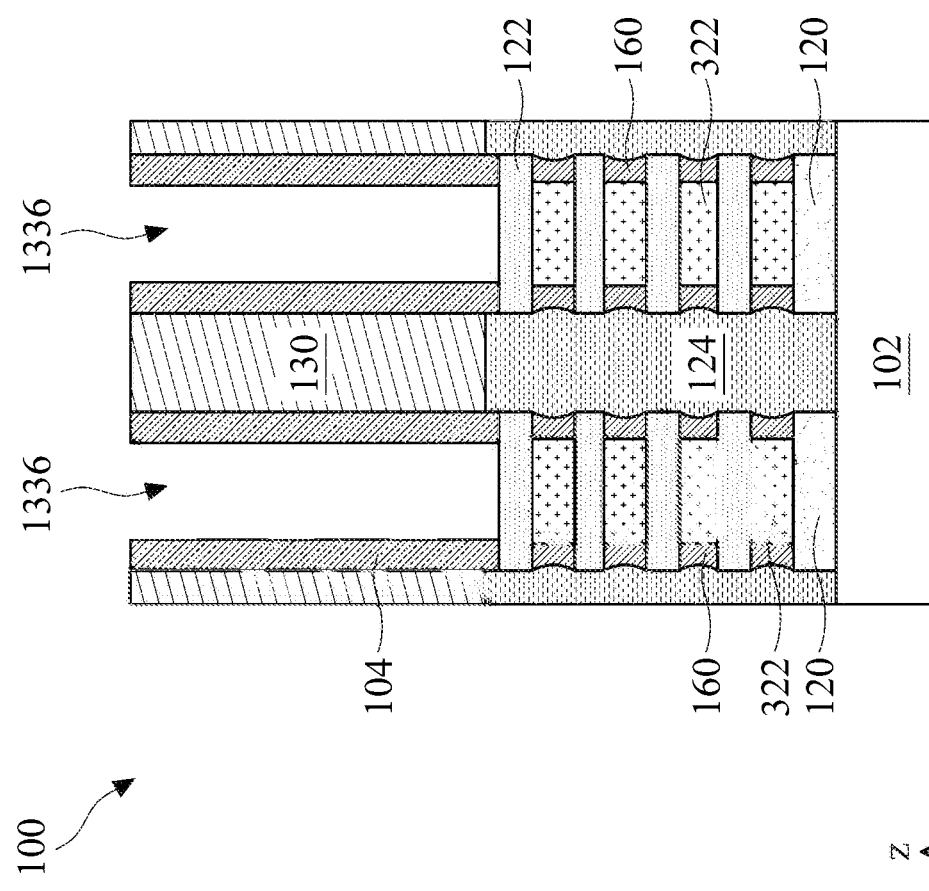
Figure 14:
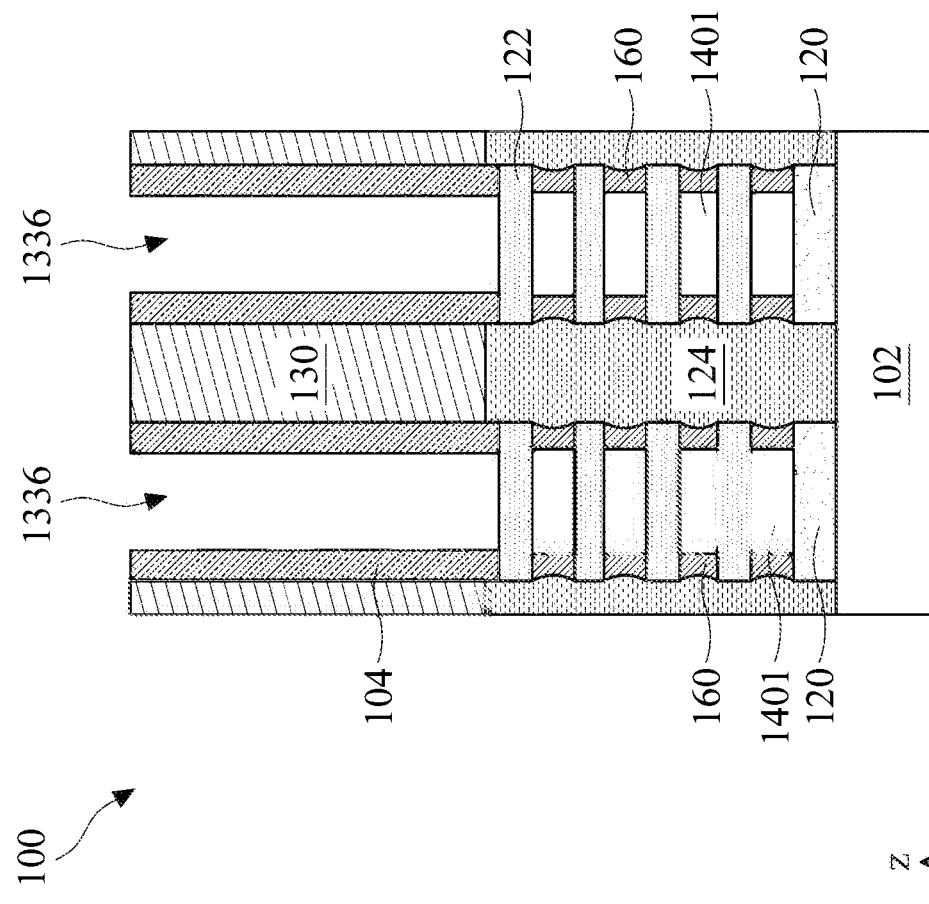

The process of forming gate structure 110 can further include (i) removing sacrificial layers 322 of FIG. 13 to form recess structures 1401 (shown in FIG. 14) and using a plasma etching process or a radical etching process; and filling a gate dielectric layer (not shown in FIG. 2) and a gate electrode (not shown in FIG. 2) in the recess structures 1401 of FIG. 14 using a suitable deposition process, such as an ALD process and a CVD process, and a suitable etch back process, such as a CMP process. Based on the disclosure herein, other processes for forming gate structure 110 are within the spirit and scope of this disclosure.

The present disclosure provides an exemplary transistor inner spacer structure and a method for forming the same. The method of forming the inner spacer structure can include depositing a dielectric layer over a fin structure's side surface and performing a cyclic dry etching process to selectively etch the dielectric layer over the fin structure. The cyclic dry etching process can be an oxygen-free radical etching process. Further, each cycle of the cyclic etching process can include a first radical etching process and a second radical etching process. The first radical etching process can apply a first halogen radical, such as a F radical, to etch the dielectric layer. The first radical etching process may adsorb the first halogen radical on the dielectric surface to form an interfacial layer. The second radical etching process can apply a second halogen radical, such as a Cl radical, to react with the interfacial layer to further etch the dielectric layer. The first and/or the second radical etching processes can selectively etch the dielectric layer over the fin structure. Further, the first and the second radical etching processes can be performed without breaking the vacuum in between. A benefit of the present disclosure, among others, is to provide an oxygen-free dry etching method to form the inner spacer structure with an improved thickness uniformity and a higher etching rate, thus improving the semiconductor device's reliability and throughput.

In some embodiments, a method can include forming a fin structure over a substrate. The fin structure can include a first channel layer and a sacrificial layer. The method can further include forming a first recess structure in a first portion of the fin structure, forming a second recess structure in the sacrificial layer of a second portion of the fin structure, forming a dielectric layer in the first and second recess structures, and performing an oxygen-free cyclic etching process to etch the dielectric layer to expose the channel layer of the second portion of the fin structure. The process of performing the oxygen-free cyclic etching process can include performing a first etching process to selectively etch the dielectric layer over the channel layer of the second portion of the fin structure with a first etching selectivity, and performing a second etching process to selectively etch the dielectric layer over the channel layer of the second portion of fin structure with a second etching selectivity greater than the first etching selectivity.

In some embodiments, a method can include forming a fin structure over a substrate, forming a recess structure in the fin structure, forming a dielectric layer over the recess structure, and performing an oxygen-free cyclic etching process to etch the dielectric layer. The process of performing the oxygen-free cyclic etching process can include performing a first etching process with a first etchant to remove a first portion of the dielectric layer and performing a second etching process with a second etchant to remove a second portion of the dielectric layer. The first etchant can include a first halogen element. The second etchant can include a second halogen element different from the first halogen element.

In some embodiments, a method can include forming a gate structure over a first portion of a substrate, forming a recess structure over a second portion of the substrate, forming a dielectric layer in the recess structure and over the second portion of the substrate, performing a cyclic etching process to etch the dielectric layer to expose the second portion of the substrate, and forming a source/drain (S/D) contact structure in the recess structure and over the dielectric layer. The process of performing the cyclic etching process can include performing a first etching process to remove a first portion of the dielectric layer, and performing a second etching process to remove a second portion of the dielectric layer. The process of performing the first etching process can include etching the first portion of the substrate at a first etching rate. The process of performing the second etching process can include etching the first portion of the substrate with a second etching rate less than the first etching rate.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a fin structure over a substrate, wherein the fin structure comprises a channel layer and a sacrificial layer;
forming a first recess structure in a first portion of the fin structure;
forming a second recess structure in the sacrificial layer of a second portion of the fin structure;
forming a dielectric layer in the first and second recess structures; and
performing an oxygen-free cyclic etching process to etch the dielectric layer to expose the channel layer of the second portion of the fin structure, comprising:
performing a first etching process to selectively etch the dielectric layer over the channel layer of the second portion of the fin structure with a first etching selectivity; and
performing a second etching process to selectively etch the dielectric layer over the channel layer of the second portion of fin structure with a second etching selectivity greater than the first etching selectivity.

2. The method of claim 1, wherein performing the first etching process comprises providing a first halogen-contained processing gas, and wherein performing the second etching process comprises providing a second halogen-contained processing gas with a different halogen element than the first halogen-contained processing gas.

3. The method of claim 1, wherein performing the first etching process comprises performing the first etching process at a first time duration, and wherein performing the second etching process comprises performing the second etching process at a second time duration greater than the first time duration.

4. The method of claim 1, wherein performing the first etching process comprises performing the first etching process with a first radio frequency (RF) power, and wherein performing the second etching process comprises performing the second etching process with a second RF power greater than the first RF power.

5. The method of claim 1, wherein performing the first etching process comprises etching the dielectric layer at a first etching rate, and wherein performing the second etching process comprises etching the dielectric layer at a second etching rate substantially equal to the first etching rate.

6. The method of claim 5, wherein performing the first etching process comprises etching the channel layer with a third etching rate, wherein performing the second etching process comprises etching the channel layer with a fourth etching rate, and wherein a ratio of the third etching rate to the first etching rate is greater than a ratio of the fourth etching rate to the second etching rate.

7. The method of claim 1, wherein performing the second etching process comprises forming an interfacial layer over the channel layer.

8. The method of claim 1, further comprising performing a third etching process to remove the dielectric layer after performing the second etching process, wherein performing the first etching process and performing the third etching process comprise providing identical etchants.

9. A method, comprising:
forming a fin structure over a substrate;
forming a recess structure in the fin structure;

forming a dielectric layer over the recess structure; and
performing an oxygen-free cyclic etching process to etch the dielectric layer, comprising:
  performing a first etching process with a first etchant to remove a first portion of the dielectric layer, wherein the first etchant comprises a first halogen element; and
  performing a second etching process with a second etchant to remove a second portion of the dielectric layer, wherein the second etchant comprises a second halogen element different from the first halogen element.

10. The method of claim 9, wherein performing the cyclic etching process comprises performing an atomic layer etching (ALE) process.

11. The method of claim 9, wherein performing the first etching process comprises providing a first halogen-contained processing gas, and wherein performing the second etching process comprises providing a second halogen-contained processing gas different from the first halogen-contained processing gas.

12. The method of claim 9, wherein performing the second etching process comprises performing an etching process that is free from the first halogen element to remove the dielectric layer.

13. The method of claim 9, wherein an atomic mass of the first halogen element is less than an other atomic mass of the second halogen element.

14. The method of claim 9, wherein performing the first etching process comprises flowing a first processing gas at a first time duration, and wherein performing the second etching process comprises flowing a second processing gas at a second time duration greater than the first time duration.

15. The method of claim 9, further comprising performing a third etching process with the first etchant after performing the second etching process.

16. A method, comprising:
  forming a gate structure over a first portion of a substrate;
  forming a recess structure over a second portion of the substrate, wherein the recess structure exposes the first portion of the substrate under the gate structure;
  forming a dielectric layer in the recess structure and over the second portion of the substrate;
  performing a cyclic etching process to etch the dielectric layer to expose the second portion of the substrate, comprising:
    performing a first etching process to remove a first portion of the dielectric layer, wherein performing the first etching process comprises etching the first portion of the substrate at a first etching rate; and
    performing a second etching process to remove a second portion of the dielectric layer, wherein performing the second etching process comprises etching the first portion of the substrate with a second etching rate less than the first etching rate; and
  forming a source/drain (S/D) contact structure in the recess structure and over the dielectric layer.

17. The method of claim 16, wherein performing the first etching process comprises performing a radical etching process to remove the dielectric layer with a third etching rate greater than the first and second etching rates.

18. The method of claim 16, wherein performing the second etching process comprises performing a radical etching process to remove the second portion of the dielectric layer with a third etching rate greater than the first and second etching rates.

19. The method of claim 16, wherein performing the first etching process comprises providing a first halogen-contained processing gas, and wherein performing the second etching process comprises providing a second halogen-contained processing gas different from the first halogen-contained processing gas.

20. The method of claim 16, wherein performing the first etching process comprises flowing a first processing gas at a first time duration, and wherein performing the second etching process comprises flowing a second processing gas at a second time duration greater than the first time duration.

* * * * *